US012621018B2

(12) United States Patent
Sivonen et al.

(10) Patent No.: US 12,621,018 B2
(45) Date of Patent: May 5, 2026

(54) CONFIGURABLE FILTER FOR SUBHARMONIC BLOCKERS IN MULTIBAND WIRELESS RECEIVERS

(71) Applicant: NORDIC SEMICONDUCTOR ASA, Trondheim (NO)

(72) Inventors: Pete Sivonen, Oulu (FI); Jarkko Jussila, Oulu (FI)

(73) Assignee: NORDIC SEMICONDUCTOR ASA, Trondheim (NO)

( * ) Notice: Subject to any disclaimer, the term of this patent is extended or adjusted under 35 U.S.C. 154(b) by 296 days.

(21) Appl. No.: 18/550,364

(22) PCT Filed: Mar. 11, 2022

(86) PCT No.: PCT/EP2022/056301
§ 371 (c)(1),
(2) Date: Sep. 13, 2023

(87) PCT Pub. No.: WO2022/194689
PCT Pub. Date: Sep. 22, 2022

(65) Prior Publication Data
US 2024/0313820 A1 Sep. 19, 2024

(30) Foreign Application Priority Data
Mar. 15, 2021 (FI) ...................................... 20215279

(51) Int. Cl.
*H04B 1/525* (2015.01)
*H03F 1/56* (2006.01)
(Continued)

(52) U.S. Cl.
CPC ............. *H04B 1/525* (2013.01); *H03F 1/565* (2013.01); *H03H 7/0153* (2013.01); *H04B 1/0057* (2013.01); *H04B 1/18* (2013.01)

(58) Field of Classification Search
CPC ...... H03F 3/19; H03F 3/245; H03F 2200/294; H03F 2200/451; H03F 1/02;
(Continued)

(56) References Cited

U.S. PATENT DOCUMENTS

| | | | |
|---|---|---|---|
| 2005/0264466 A1 | 12/2005 | Hibino et al. | |
| 2014/0327496 A1 | 11/2014 | Zuo et al. | |

(Continued)

FOREIGN PATENT DOCUMENTS

| | | |
|---|---|---|
| KR | 20130128599 A | 11/2013 |
| WO | 2019092403 A1 | 5/2019 |

OTHER PUBLICATIONS

International Search Report for PCT/EP2022/056301, mailed Jul. 4, 2022, 5 pages.
(Continued)

*Primary Examiner* — Ajibola A Akinyemi
(74) *Attorney, Agent, or Firm* — Nixon & Vanderhye PC

(57) ABSTRACT

According to an aspect, there is provided a tunable radio frequency filter (209) for preselection in a multiband radio receiver or transceiver with a low-noise amplifier with a single-ended input. The tunable radio frequency filter comprises a first capacitor ($C_1$, 1001) having a first terminal for connecting to at least one antenna of the multiband radio receiver or transceiver and a second terminal; and a series resonant circuit, connected between the second terminal of the first capacitor and the ground. The series resonant circuit comprises a first inductor ($L_1$ 1003) and a tunable capacitor ($C_t$, 1004) connected in series with first inductor and having a plurality of tuning values corresponding to operating frequency bands of the multiband radio receiver or transceiver. The tunable capacitor is implemented in an integrated circuit. The series resonant circuit is configured to be resonant at a plurality of first subharmonics of frequencies of
(Continued)

the operating frequency bands. Optionally the filter comprises a second capacitor (C2, 1002) and a second inductor (L2, 1010) in series between the resonant circuit to ground and the input of the LNA. The second inductor adds to impedance matching and low pass filtering above the operating frequency bands.

12 Claims, 6 Drawing Sheets

(51) Int. Cl.
　　*H03H 7/01*　　　　(2006.01)
　　*H04B 1/00*　　　　(2006.01)
　　*H04B 1/18*　　　　(2006.01)

(58) Field of Classification Search
　　CPC ........ H03F 1/0227; H03F 3/195; H03F 3/211;
　　　　　　H03F 1/56; H03F 3/21; H03F 3/45179;
　　　　　　H03F 3/45475; H03F 2200/213; H03F
　　　　　　　　　　　　　　　　　　　　2200/546
　　USPC ...................................................... 455/552.1
　　See application file for complete search history.

(56) References Cited

U.S. PATENT DOCUMENTS

| | | |
|---|---|---|
| 2014/0347142 A1 | 11/2014 | Chang et al. |
| 2015/0009079 A1 | 1/2015 | Bøjer |
| 2015/0131492 A1* | 5/2015 | Morris, III ........... H03H 7/0115 |
| | | 370/278 |
| 2015/0249479 A1* | 9/2015 | Nobbe ................. H04B 15/005 |
| | | 455/77 |
| 2017/0026031 A1 | 1/2017 | Levesque |
| 2020/0161548 A1 | 5/2020 | Masse et al. |
| 2020/0220242 A1 | 7/2020 | Kim et al. |
| 2020/0358461 A1* | 11/2020 | Jussila ................. H04B 1/1036 |

OTHER PUBLICATIONS

Written Opinion of the ISA for PCT/EP2022/056301, mailed Jul. 4, 2022, 9 pages.
Search Report for FI20215279, mailed Nov. 15, 2021, 2 pages.
Ryynanen et al., "Integrated circuits for multiband multimode receivers", IEEE Circuits and Systems Magazine, vol. 6, No. 2, Jan. 2006, pp. 5-16, XP011142158.
Bahramzy et al., A Tunable RF Front-End With Narrowband Antennas for Mobile Devices, IEEE Transactions on Microwave Theory and Techniques, vol. 63, No. 10, Oct. 2015, 11 pages.

* cited by examiner

CONFIGURABLE FILTER FOR SUBHARMONIC BLOCKERS IN MULTIBAND WIRELESS RECEIVERS

This application is the U.S. national phase of International Application No. PCT/EP2022/056301 filed Mar. 11, 2022, which designated the U.S. and claims priority to FI patent application No. 20215279 filed Mar. 15, 2021, the entire contents of each of which are hereby incorporated by reference.

TECHNICAL FIELD

Various example embodiments relate to RF filters for radio receivers and transceivers.

BACKGROUND

Integrated radio frequency (RF) receivers and transceivers are extensively employed in wireless communication devices such as in cellular phones, tablets, and Internet of things (IoT) machines. As modern wireless devices usually operate at multiple frequency bands and they support many wireless standards, the corresponding radio frequency integrated circuits (RFICs) need to provide multiband and multimode operation.

In general, a separate RF preselection filter and an associated separate low-noise amplifier is often needed for each operating frequency band (or subband) to filter and attenuate harmful out-of-band blocking signals (or simply blockers), which can drive the receiver into compression. Blocking signals may also, e.g., desensitize the receiver and lower the signal-to-noise-ratio (SNR) of the desired received RF signal. However, in some systems such as in half-duplex RF transceivers where the receiver and transmitter do not operate simultaneously, it is possible to design the integrated radio receiver to be sufficiently linear so as to tolerate the out-of-band blocking signals without providing heavy filtering for them before they enter to the LNA. In such systems, it may be possible to omit the conventional band-dedicated RF preselection filters. This leads to lower complexity and bills of material (BOM) compared to the multiband receiver. However, some alternative filtering solution is usually still needed for rejecting certain blocking signals so as to ensure satisfactory performance for the receiver.

BRIEF DESCRIPTION

According to a first aspect, there is provided a tunable radio frequency filter for preselection in a multiband radio receiver or transceiver with a low-noise amplifier with a single-ended input. The tunable radio frequency filter comprises a first capacitor having a first terminal for connecting to at least one antenna of the multiband radio receiver or transceiver and a second terminal; and a series resonant circuit, connected between the second terminal of the first capacitor and the ground. The series resonant circuit comprises a first inductor and a tunable capacitor connected in series with first inductor and having a plurality of tuning values corresponding to operating frequency bands of the multi-band radio receiver or transceiver. The tunable capacitor is implemented in an integrated circuit. The series resonant circuit is configured to be resonant at a plurality of first subharmonics of frequencies of the operating frequency bands. A first subharmonic of a given frequency corresponds, here and in the following, to a frequency which is equal to said given frequency divided by two.

According to a second aspect, there is provided a differential tunable radio frequency filter for a multiband radio receiver or transceiver with a low-noise amplifier with a differential input comprising an inverting input and a non-inverting input. The differential tunable radio frequency filter comprises a pair of tunable radio frequency filters according to the first aspect comprising a first tunable radio frequency filter for connecting to a non-inverting input of the differential low-noise amplifier and a second tunable radio frequency filter for connecting to an inverting input of the differential low-noise amplifier.

According to a third aspect, there is provided a multiband radio receiver or transceiver with at least one low-noise amplifier with a single-ended input. Said multiband radio receiver or transceiver comprises at least one tunable radio frequency filter according to the first aspect acting as a preselection filter of the multiband radio receiver or transceiver.

According to a fourth aspect, there is provided a multiband radio receiver or transceiver with at least one low-noise amplifier having a differential input. The multiband radio receiver comprises a differential tunable radio frequency filter according to the second aspect acting as a non-band-specific preselection filter of the multiband radio receiver or transceiver.

The first, second, third and fourth aspects provide the technical effect that at least the first and second subharmonics of the operating frequencies of the multiple operating frequency bands of a multiband radio receiver or transceiver may be filtered using a single radio frequency filter. A second subharmonic of a given frequency corresponds, here and in the following, to a frequency which is equal to said given frequency divided by three. The first and second subharmonics are especially detrimental for the operation of the radio receiver or transceiver as they are capable of generating, in the low-noise amplifier of the radio receiver or transceiver, harmonic distortion components at the operating frequency bands. The tunable radio frequency filter may further provide impedance matching to the input of a low-noise amplifier of a multiband radio receiver or transceiver.

The first, second, third and fourth aspects provide the advantage that the complexity and BOM of radio receivers or transceivers employing the proposed tunable radio frequency filters are significantly reduced compared to radio receivers with a plurality of band-specific RF preselection filters. Further, the proposed tunable RF filters do not increase power consumption of the multiband radio receiver (or transceiver) and require only a small silicon area.

Embodiments are defined in the dependent claims. The scope of protection sought for various embodiments is set out by the independent claims.

The embodiments and features, if any, described in this specification that do not fall under the scope of the independent claims are to be interpreted as examples useful for understanding various embodiments of the invention.

BRIEF DESCRIPTION OF DRAWINGS

In the following, example embodiments will be described in greater detail with reference to the attached drawings, in which.

DETAILED DESCRIPTION OF SOME EMBODIMENTS

Figure 1:
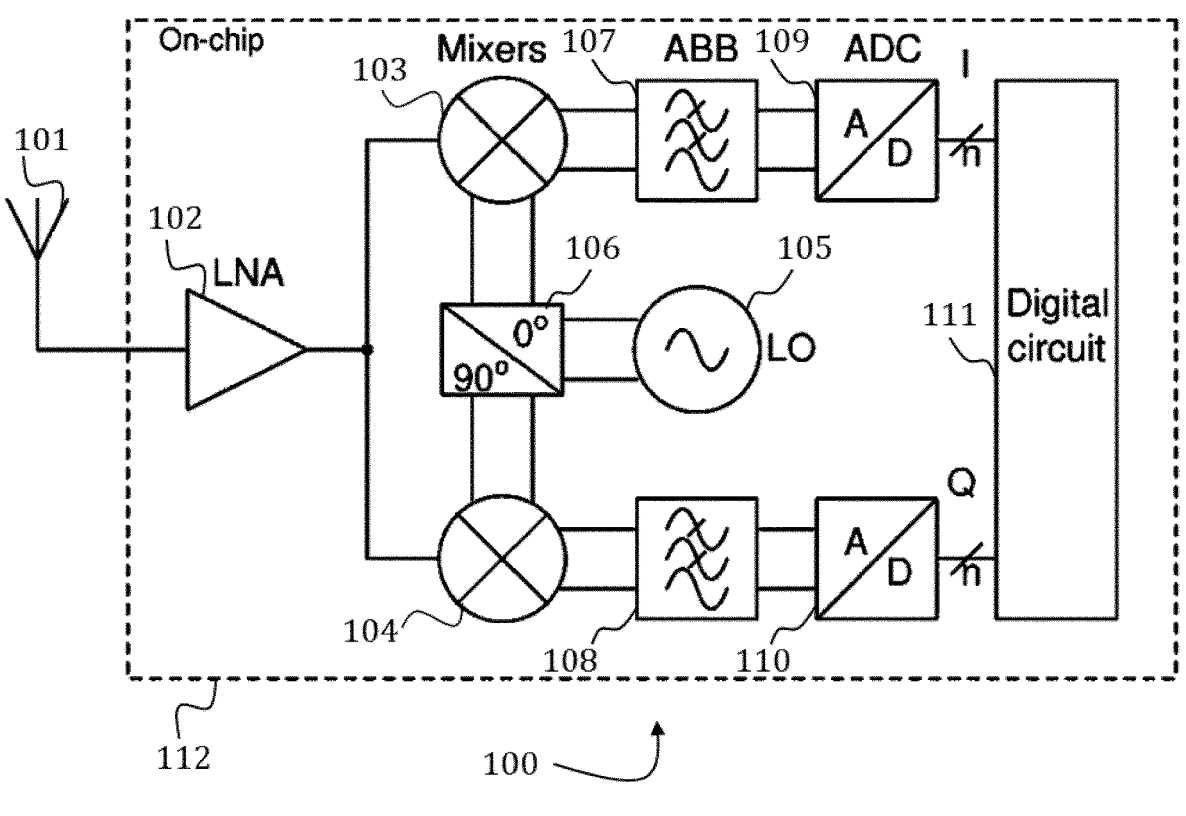
FIG. 1 illustrates a multiband radio receiver without RF preselection filters to which embodiments may be employed.

The following embodiments are only presented as examples. Although the specification may refer to "an", "one", or "some" embodiment(s) and/or example(s) in several locations of the text, this does not necessarily mean that each reference is made to the same embodiment(s) or example(s), or that a particular feature only applies to a single embodiment and/or example. Single features of different embodiments and/or examples may also be combined to provide other embodiments and/or examples.

In the following, terms "operating frequency" and "operating frequency band" refer specifically to a frequency or a frequency band used for reception (not for transmission).

RF preselection filters (or simply preselectors) are conventionally used in radio receivers between the antenna and the low-noise amplifier (LNA) for filtering out blocking signals from the received RF signal. In radio, and wireless communications in general, blocking is a condition in a receiver in which an off-frequency signal (usually further off-frequency than the immediately adjacent channel) causes the signal of interest to be suppressed. Blocking rejection is the ability of a receiver to tolerate an off-frequency signal and avoid blocking.

In some frequency-division multiplexing (FDD) radio systems, such as in 3G and 4G cellular systems, the receiver and the transmitter of the same RF transceiver are receiving and transmitting, respectively, simultaneously (full-duplex). Thus, in such FDD RF transceiver, the RF preselection filter is also needed to attenuate the large transmitted signals, which otherwise would leak to the receiver input via common receiver-transmitter antenna. In such cases, the receiver RF preselection filter may also be realized as a duplexer filter, which also includes the transmitter RF filter. In practice, it is very difficult to omit the receiver RF preselection filter in full-duplex FDD systems, since the level of the transmitted RF signal at the antenna can be as large as in the order of +30 dBm.

In contrast to said 3G/4G full-duplex cellular FDD RF transceivers, in at least some half-duplex RF transceivers, the receiver and transmitter do not operate simultaneously. As a result, while receiving possibly a very weak RF signal, the receiver does not need to tolerate large RF signals transmitted by the transmitter of the same RF transceiver. For example, in half-duplex Long Term Evolution (LTE) radio systems for IoT applications, it is required that the receiver needs to tolerate at maximum of −15-dBm out-of-band signal at the antenna port while providing sufficiently large SNR for the desired received signal. This blocking signal requirement is so relaxed that it may be possible to design the integrated radio receiver to be sufficiently linear to tolerate the out-of-band blockers without providing heavy filtering for them before they enter to the low-noise amplifier (LNA). In this case, it may be possible to omit the conventional band-specific RF preselection filters. Getting rid of the preselection filters leads to lower complexity and lower bills of material (BOM) compared to the multiband receiver.

FIG. 1 illustrates one such radio receiver 100 without preselection filters and comprising only a single low-noise amplifier for amplifying all of the operating frequency bands of the radio receiver 100. Specifically, the radio receiver 100 is a multiband direct conversion or zero intermediate frequency (zero-IF) radio receiver using IQ demodulation. The radio receiver 100 may form a part of a radio transceiver (not shown in FIG. 1). The radio receiver 100 may be comprised, for example, in a user device (or a terminal device) or in an access or relay node.

As the embodiments to be discussed below may be specifically implemented in the radio receiver 100 (specifically between the at least one antenna 101 and the low-noise amplifier 102), the operation of the radio receiver 100 is discussed briefly in the following for completeness of presentation. It should, however, be noted that the embodiments are not restricted to be used only in connection with the radio receiver 100 given as an example but a person skilled in the art may apply the solution to other radio receivers or transceivers provided with necessary properties.

Referring to FIG. 1, the radio receiver 100 comprises, similar to any conventional RF receiver, at least one antenna 101 followed by at least one low-noise amplifier (LNA) 102. These elements 101, 102 are used for receiving and preprocessing an RF signal received by the radio receiver. The at least one antenna 101 used for receiving or capturing the RF signal propagating in free space (e.g., in air) may be of any known antenna type. Similarly, the low-noise amplifier 102 may be any conventional low-noise amplifier. Said at least one antenna element 101 and said low-noise amplifier 102 may be specifically configured to operate at the plurality of operating frequency bands of the radio receiver 100.

First and second RF mixers 103, 104 are used for mixing the received amplified RF signal, respectively, with in-phase (0°) and quadrature (90°) signals generated by a local oscillator 105 via the 0°/90° phase shifting element 106. These mixing operations result in I and Q baseband signals (or specifically a differential pair of I baseband signals and a differential pair of Q baseband signals as differential signaling is used here), as illustrated in top and bottom processing chains of FIG. 1, respectively. In other words, elements 103, 104, 105, 106 form an IQ demodulator. Said I and Q baseband signals are filtered by first and second analog baseband (ABB) filters 107, 108 and subsequently converted to I and Q digital signals using first and second analog-to-digital (ADC) converters 109, 110, respectively. The ABB filters 107, 108 may be specifically low-pass filters. The I and Q digital signals are processed by the digital circuit 111 (or digital processing unit). Said digital processing may comprise, for example, digital filtering or other digital signal processing and/or storing the I and Q digital signals to a memory. As depicted in FIG. 1, differential signaling is used by the first and second mixers 103, 104, the ABB filters 107, 108 and the analog-to-digital converters 109, 110 (for input).

In FIG. 1, only the antenna may be a so-called off-chip element (i.e., elements not implemented in an integrated circuit) while the rest of the illustrated elements 102 to 111 may be so-called on-chip elements (i.e., elements implemented in an integrated circuit), as indicated also by the dashed line 112.

It should be emphasized that FIG. 1 corresponds to one simplified example of a radio receiver to which tunable radio frequency filters according to embodiments may be applied. In practical implementations of a radio receiver used in connection with embodiments, one or more further analog and/or digital elements (e.g., one or more antenna matching circuits, one or more RF and/or baseband filters, one or more amplifiers and/or one or more harmonic rejection downconversion mixers) may be provided.

Removal of the band-specific preselection filters from the conventional multiband radio receiver architecture as illustrated in FIG. 1 obviously comes with the disadvantage that blocking signals are no longer filtered out. The blocking signals, thus, have to be either simply tolerated or handled (e.g., filtered out) using alternative means. For example, harmonic rejection downconversion mixers following the LNA may be used to reject the blocking signals situated at the harmonics of the local oscillator (LO) signal driving the mixers. However, especially the blocking signals situated at the subharmonic frequencies of the operating frequencies of the radio receiver 100 may prove, in practice, to be very problematic for the performance of such preselection filterless receivers. Subharmonic frequency blocking signals are situated at subharmonic frequencies $f_{BL,SH}$, which relate to the central frequency of a given operating frequency band $f_{RX}$ according to the following equation:

$$f_{BL,SH} = \frac{f_{RX}}{n}, \qquad (1)$$

where n is an integer larger than one. The case where n=2 corresponds to the first subharmonic, the case where n=3 corresponds to the second subharmonic and so on.

To gain insight on why subharmonic frequency blocking signals may be especially detrimental to the performance of the radio receiver or transceiver, the non-linear behavior of the low-noise amplifier is discussed briefly in the following. The non-linear input/output characteristics of the LNA may be approximated by $$y(t) \approx \alpha_1 x(t) + \alpha_2 x^2(t) + \alpha_3 x^3(t) \ldots + \alpha_n x^n(t), \qquad (2)$$

where y(t) is the output of the LNA, x(t) is the input of the LNA, $\alpha_1, \ldots, \alpha_n$ are some (arbitrary) coefficients and t is time. Now, if a subharmonic blocking signal $x(t)=A_{BL,SH} \cos(\omega_{BL,SH}t)$ appears at the LNA input, the LNA, modelled as a non-linear system according to (2), will generate frequency components that are integer multiples (harmonics) of the input frequency ($f_{BL,SH}$). More precisely, an $n^{th}$-order nonlinearity in the LNA will generate harmonic distortion component, whose output amplitude grows in proportion to $A^n$ and which appears at the LNA output at the frequency of $nf_{BL,SH}$. In other words, the $n^{th}$-order nonlinearity creates a harmonic distortion component at the frequency of $nf_{BL,SH}=nf_{RX}/n=f_{RX}$. In other words, the frequency of said harmonic distortion component coincides with the operating frequency band of the radio receiver. As a result, the blocking signal appearing at the subharmonic frequency of the desired RF signal to be received can severely degrade the SNR of the received RF signal. The SNR can degrade due to said harmonic distortion component at $f_{RX}$ even if the receiver was not compressed by the blocking signal at $f_{BL,SH}$. For example, the second-order nonlinearity in the LNA generates a harmonic distortion component, which appears at the LNA output at $2f_{BL,SH}$ and whose amplitude grows in proportion to $A^2$ (A being the amplitude of the input signal). Correspondingly, the LNA third-order nonlinearity creates harmonic distortion component, which appears at the LNA output at $3f_{BL,SH}$ and whose amplitude grows in proportion to $A^3$.

As an example, an LTE receiver is considered at frequency band 8 (925-960 MHz). Now, if the receiver is tuned to receive, for example, at 960 MHz, subharmonic frequency blockers appearing at 480 MHz and 320 MHz can severely degrade the SNR of the desired signal via LNA second- and third-order nonlinearity, respectively.

In practice, usually the subharmonic frequency blocking signals located at $f_{RX}/2$ and $f_{RX}/3$ are the most problematic, since the higher-order harmonics (i.e., fourth order and higher) are at much lower level at the LNA output. In other words, usually the second- and third-order nonlinearity dominate the LNA harmonic distortion. In addition, fourth- and higher-order (n≥4) subharmonic frequency blocking signals are usually located at sufficiently low frequency that they are attenuated already at the LNA input circuit before they create harmful harmonic distortion. Also, they are situated far away from the desired RF signal.

In a radio receiver without an RF preselection filter (such as the one illustrated in FIG. 1), subharmonic frequency blocking signals experience no filtering and thus practically no attenuation before they enter the LNA. As a result, especially the blocking signals at $f_{RX}/2$ and $f_{RX}/3$ can be very troublesome as they harm the reception of the desired RF signal by generating harmonic distortion components at $f_{RX}$. Accordingly, circuit techniques are needed to lower especially second- and third-order harmonic distortion components due to the subharmonic blockers and to alleviate the realization of RF preselection filterless radio receiver.

Second- and third-order harmonic distortion may be lowered in the LNA by applying certain linearization techniques. However, many or most of these techniques increase the complexity, power consumption, and noise figure (NF) of the LNA. In addition, some of the linearization techniques are narrowband, which means they are ill-suited for the realization of RF preselection filterless radio receiver, which needs to tune to multiple frequency bands.

The embodiments to be discussed below in detail seek to provide non-band-specific tunable filtering solutions for getting rid of the most significant of subharmonic blocking signals (namely, the ones occurring at first and second subharmonics of the central operating frequencies). While introducing filters according to embodiments to the radio receiver 100 of FIG. 1 naturally increases complexity of the radio receiver, the complexity of solutions according to embodiments is still significantly reduced compared to radio receivers with a plurality of band-specific RF preselection filters. Further, the proposed tunable RF filters do not increase power consumption of the multiband radio receiver (or transceiver) and require only a small silicon area.

Figure 2:
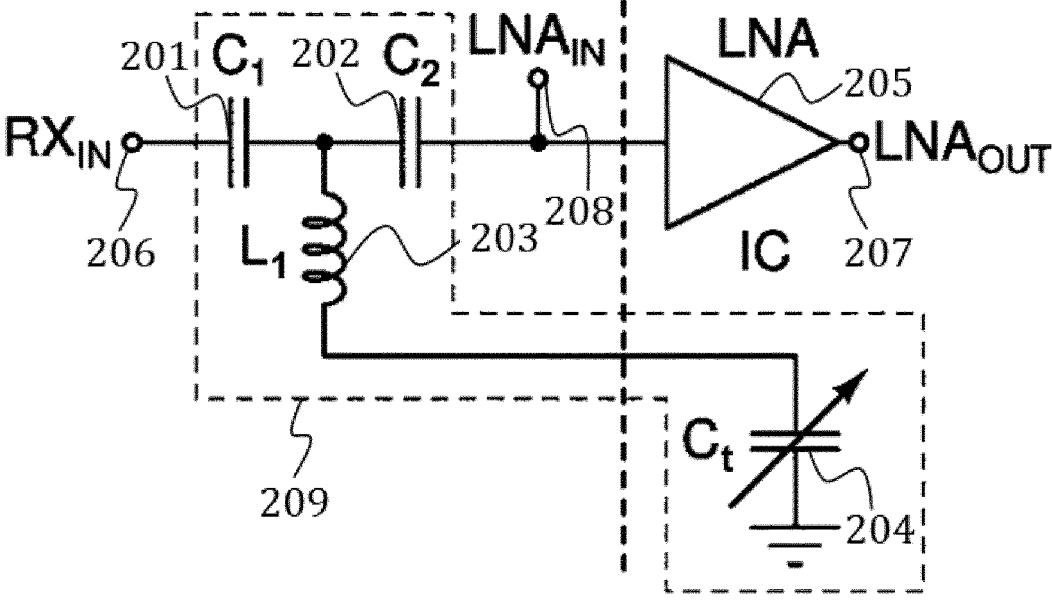
FIG. 2 illustrates a tunable RF filter according to embodiments connected to an associated low-noise amplifier.

FIG. 2 illustrates a tunable (or equally configurable) radio frequency (RF) filter 209 according to an embodiment suitable for a multiband radio receiver or transceiver such as the radio receiver 100 of FIG. 1. Specifically, the tunable RF filter 209 of FIG. 2 may, when integrated to a radio receiver or transceiver between the antenna(s) and the LNA, act as a high-pass filter for filtering the subharmonics (at least the first and second subharmonics) of the operating frequencies while allowing the main RF signal at the operating frequencies of the radio receiver or transceiver to pass. FIG. 2 also shows a single-ended low-noise amplifier 205 (of said multiband radio receiver or transceiver) electrically connected to said tunable RF filter 209 and providing an output (or output port) 207 to further stages of the radio receiver or transceiver (as illustrated in FIG. 1). In general, the low-noise amplifier 205 may be any low-noise amplifier with a single-ended input (and a single-ended or differential output).

Referring to FIG. 2, the tunable radio frequency filter 209 comprises a first capacitor 201 ($C_1$), a second capacitor 202 ($C_2$) connected (via its first terminal) to a second terminal of the first capacitor 201 and a series resonant circuit (comprising elements 203, 204) arranged in parallel and connected to the first and second capacitors 201, 202 and to the ground. Specifically, one of the terminals of the series resonant circuit is connected between the first and second capacitors 201, 202 and the other to the ground. The first capacitor 201 has a first terminal 206 for connecting at least one antenna of the multiband radio receiver or transceiver while the second capacitor 202 has a second terminal 208 for connecting the low-noise amplifier 205 of the multiband radio receiver or transceiver.

The series resonant circuit comprises a first inductor 203 ($L_1$) and a tunable capacitor 204 ($C_t$) connected in series with the first inductor 203 ($L_1$). The series resonant circuit is, thus, a series LC circuit (though other series resonant circuits comprising $L_1$ and $C_t$ connected in series such as a series RLC circuit may be employed in other embodiments). The tunable capacitor 204 ($C_t$) has a plurality of tuning (capacitance) values corresponding to operating frequency bands of the multiband radio receiver or transceiver. In other words, each of a plurality of operating frequency bands of the radio receiver or transceiver is associated with a certain tuning value or setting of the tunable capacitor 204. The tunable capacitor 204 may be called equally a configurable capacitor. The capacitance of the tunable capacitor 204 may be tuned or switched, to implement the plurality of tuning (capacitance) values, by discrete means or continuously, e.g., by using at least one varactor. While FIG. 2 illustrates a circuit where the first inductor 203 is connected to the first and second capacitors 201, 202 and the tunable capacitor 204 is connected to the ground, in other embodiments the position of the two elements 203, 204 may be reversed (the relative order of said elements 203, 204 in the series LC circuit is of no consequence). In some embodiments, one or more further circuit components may be included in the series resonant circuit.

To overcome the aforementioned problem of blocking signals at subharmonics of the operating frequencies of the radio receiver or transceiver, the series resonant circuit is configured to be resonant at a plurality of first subharmonics of frequencies (preferably, central frequencies or at least substantially central frequencies) of the operating frequency bands. In other words, the tunable capacitor 204 set to a given tuning value is in resonance with the first inductor 203 having a fixed value at a frequency corresponding to a first subharmonic of a frequency comprised in one of the plurality of operating frequency bands of the radio receiver or transceiver. "Substantially central" may be defined here, e.g., as being closer to the central frequency of an associated frequency band than to either of the end points of said frequency band. Consequently, any signal components at said first subharmonics are filtered out. This relationship may be written as the equation $$\frac{1}{2\pi\sqrt{L_1 C_{t,n}}} = f_{r,n} = \frac{f_{RX,n}}{2}, \tag{3}$$

where $C_{t,n}$ is the nth capacitance value of the tunable capacitor 204 ($C_t$), $f_{r,n}$ is the resonance frequency of the series (LC) resonant circuit when the nth capacitance value has been configured to the tunable capacitor 204 ($C_t$) and $f_{RX,n}$ is a (central) frequency of the nth operating frequency band of the radio receiver or transceiver. Here, n is an integer larger than one.

The tunable capacitor 204 is specifically implemented in an integrated circuit, as indicated by the vertical dashed line of FIG. 2 separating on-chip and off-chip components. In other words, the tunable capacitor 204 is an on-chip component. Specifically, the tunable capacitor 204 may be implemented in an integrated circuit of the radio receiver or transceiver or in a separate integrated circuit. The capacitance value of the tunable capacitor 204 is, thus, configured on-chip (the tunable capacitor 204 being specifically a digitally tunable capacitor). The other circuit elements 201, 202, 203 of the tunable RF filter 209 may be non-tunable (discrete) off-chip components (though in other embodiments at least some of them may be on-chip components as will be described in more detail connection with FIGS. 7 and 8).

In some embodiments, the first and second capacitors 201, 202 ($C_1$ and $C_2$) may specifically have different capacitance values. In some embodiments, the value of the second capacitor 202 ($C_2$) may be larger than the value of the first capacitor 202 ($C_1$). In other embodiments, the inequality $0.5 C_1 < C_2 < C_1$ (or just $0.5 C_1 < C_2$) may hold. By employing unequal capacitance values for the first and second capacitors 202, 202, the tunable RF filter 209 may be configured to provide, in addition to the subharmonic filtering functionality, also impedance matching to an input impedance of the low-noise amplifier 205 at the operating frequency bands of the radio receiver or transceiver. In other words, the tunable multiband RF filter 209 may be configured to match or transform the LNA input impedance to the source or antenna resistance.

In the following, the properties of the proposed tunable LC high-pass filter 207 are discussed in more detail in connection with equivalent circuits of FIGS. 3 to 5 corresponding to operation at a (central) frequency of a given operating frequency band $f_{RX}$, at a first subharmonic $f_{RX}/2$ and at a second subharmonic $f_{RX}/3$.

In the proposed configurable LC high-pass filter, the series $L_1 C_t$ resonance circuit is set to resonate at the subharmonic blocking signal frequency of $f_{RX}/2$ while the receiver is tuned to receive at $f_{RX}$, as was described above. At $f_{RX}/2$, the impedance $Z_{LC1}$ of the series $L_1 C_t$ resonance circuit may be written as $$Z_{LC1}\left(\frac{\omega_{RX}}{2}\right) = \frac{j\omega_{RX}L_1}{2} + \frac{2}{j\omega_{RX}C_t} + R_{PAR} = R_{PAR} \tag{4}$$

where $R_{PAR}$ is a resistance term modelling the losses in the tunable LC high-pass filter (not shown in FIG. 2) and the resonance condition at $f_{RX}/2$ has been used:

$$\omega_{BL,SH}^2 = \left(\frac{\omega_{RX}}{2}\right)^2 = \frac{1}{L_1 C_t}. \tag{5}$$

In practice, $R_{PAR}$ takes into account for example losses in the off-chip inductor (for instance parasitic series resistance associated with inductor windings) and on-resistance of conducting NMOS switches of digitally tunable capacitor $C_t$ (whose control voltage at gate is high). In practice, the resistive losses in capacitors $C_1$-$C_2$ may usually be neglected.

Based on (4), the impedance of the series $L_1C_t$ resonance circuit at the desired operating frequency $f_{RX}$ can be written as $$Z_{LC1}(\omega_{RX}) = \quad (6)$$
$$j\omega_{RX}\left(L_1 - \frac{1}{\omega_{RX}^2 C_t}\right) + R_{PAR} = j\omega_{RX}\frac{3L_1}{4} + R_{PAR} = j\omega_{RX}L_{EQ} + R_{PAR},$$

where $L_{EQ}$ is an equivalent inductance term defined as $L_{EQ}=3L_1/4$. In other words, since the series $L_1C_t$ resonance circuit is tuned to resonate at $f_{RX}/2$, it can be modelled as an equivalent inductance $L_{EQ}=3L_1/4$ at $f_{RX}$. It should be emphasized that said approximation works only at $f_{RX}$ or at narrow frequency band around $f_{RX}$.

Figure 3:
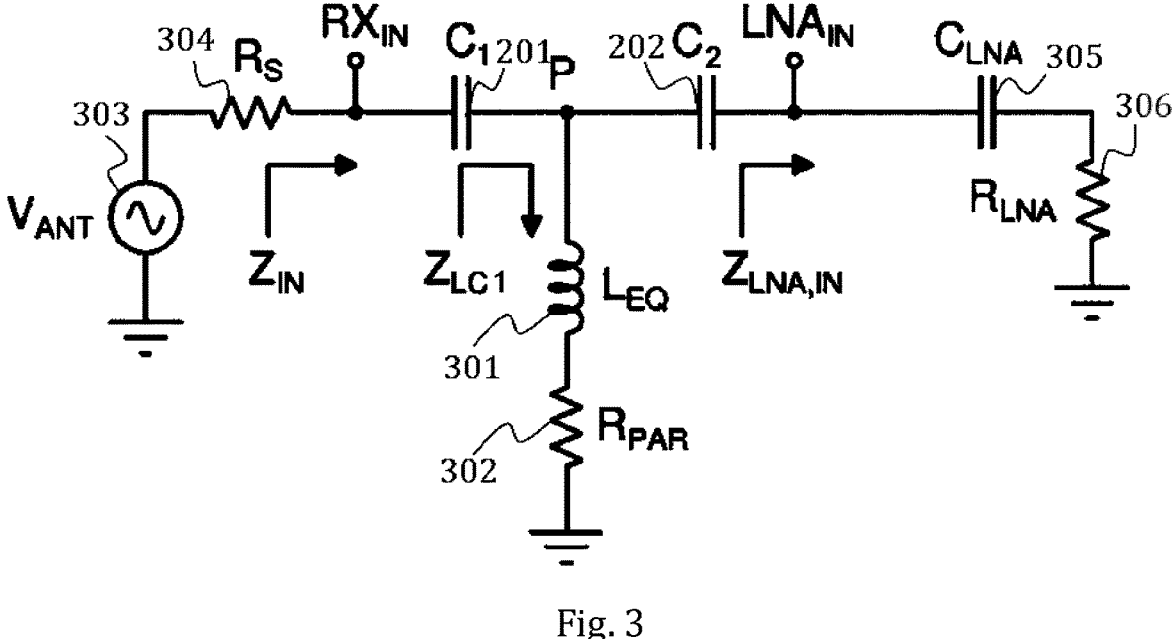
FIGS. 3 to 5 illustrate equivalent circuits of the tunable RF filter of FIG. 2 at an operating frequency of the radio receiver or transceiver, at a first subharmonic thereof and at a second subharmonic thereof, respectively.

A corresponding equivalent circuit at $f_{RX}$ is illustrated in FIG. 3 with elements 301, 302 corresponding to the terms $L_{EQ}$ and $R_{PAR}$, respectively.

Let us assume that at the frequency of interest $f_{RX}$, the LNA input impedance $Z_{LNA,IN}$ can be modelled by a series impedance consisting of resistor 305 ($R_{LNA}$) and capacitor 306 ($C_{LNA}$)

$$Z_{LNA}(\omega_{RX}) = R_{LNA} + \frac{1}{j\omega_{RX}C_{LNA}} \quad (7)$$

as also shown in FIG. 3. While this assumption may not be valid in general, it is usually reasonable at the desired operating RF frequency for most of the LNA topologies. If instead the LNA input impedance can be better modelled with a resistor in parallel with a parasitic capacitance, it can be transformed to the series impedance consisting resistor in series with capacitor at the narrow frequency band of interest by using a parallel-to-series conversion.

Based on FIG. 3, it may be shown that the necessary conditions for the (complex) input impedance ($Z_{IN}$) of the proposed high-pass LC filter followed by the LNA to be matched to the antenna or source resistance 304 ($R_S$) may be written as the following matching conditions:

$$Z_{IN}(\omega_{RX}) = R_S = \frac{(\omega_{RX}L_{EQ})^2}{R_{LNA}} \quad (8)$$

$$\omega_{RX}^2 = \frac{1}{L_{EQ}C_1} \quad (9)$$

$$C_2 = \frac{C_1 C_{LNA}}{C_{LNA} - C_1}. \quad (10)$$

At the reception frequency ($f_{RX}$), the receiver input impedance ($Z_{IN}$) can be matched to the antenna resistance ($R_S$, usually 50Ω), i.e., the condition $Z_{IN}=R_S$ may be satisfied, by choosing the RF filter component values as follows. For a given LNA input resistance ($R_{LNA}$) and input capacitance ($C_{LNA}$), the RF filter inductance of $L_1$ (and thus also $L_{EQ}$) is selected so as to set the RF filter input resistance to $R_S$. The first capacitance of $C_1$ may then be selected to resonate with $L_{EQ}$ at $f_{RX}$. Finally, the value of the second capacitance $C_2$ may be chosen to compensate for the LNA input capacitance $C_{LNA}$. If we have $C_{LNA}>>C_1$, $C_2\neq C_1$ also holds. The much greater than (">>") condition may be defined, e.g., as being at least 10, 20, 50 or 100 times as large. This design flow of the proposed configurable RF high-pass filter is only approximative and exemplary and careful simulations are necessary to optimize the performance of the RF filter together with actual LNA.

The analysis presented above is strictly valid only at single frequency or at $f_{RX}$. On the other hand, the configurable high-pass LC filter needs to be tunable for operation at multiple frequency bands. Fortunately, if the filter needs to be configurable to moderately wide band of frequencies, the input matching may be considered adequate for most purposes. The quality of the receiver input matching can be measured in terms of input reflection coefficient ($s_{11}$)

$$S_{11} = \frac{Z_{IN} - R_S}{Z_{IN} + R_S}. \quad (11)$$

Ideally (i.e., when there is no reflection), we have $s_{11}=0$ (absolute value). In practice, however, it is usually sufficient to have $s_{11}$ below −10 dB or −15 dB. Here, the decibel value is calculated according to $20 \log_{10}|s_{11}|$.

In some embodiments, the capacitance value of the first and second capacitors $C_1$ and $C_2$, respectively, and the inductance value of the first inductor $L_1$ may be specifically selected such that impedance matching is optimized over the operating frequency bands of the radio receiver or transceiver. In general, perfect matching is not possible at all frequency bands simultaneously so some compromises need to be made in the optimization. For example, the capacitance value of the first and second capacitors $C_1$ and $C_2$, respectively, and the inductance value of the first inductor $L_1$ may be selected such that impedance matching (according to the two matching conditions) is achieved at a specific frequency $f_{RX0}$ of an operating frequency band of the radio receiver or transceiver. Said specific frequency $f_{RX0}$ may be, for example, a frequency (preferably, a central frequency or a substantially central frequency) of the centermost operating frequency band of the radio receiver or transceiver.

In some embodiments, values of the first capacitor $C_1$, the second capacitor $C_2$ and the first inductor $L_1$ and the plurality of tuning values of the tunable capacitor $C_t$ may have been selected for optimizing impedance matching (i.e., $s_{11}$ parameter) to an input impedance of the low-noise amplifier of the multiband radio receiver or transceiver over the operating frequency bands of the multiband radio receiver or transceiver while maintaining attenuation at the first subharmonics and the second subharmonics of said frequencies (e.g., central or substantially central frequencies) of the operating frequency bands when corresponding ones of the plurality of tuning values are used for the tunable capacitor above respective pre-defined levels.

In other embodiments, values of the first capacitor $C_1$, the second capacitor $C_2$ and the first inductor $L_1$ and the plurality of tuning values of the tunable capacitor $C_t$ may have been selected for maximizing attenuation at the first subharmonics and the second subharmonics of said frequencies of the operating frequency bands when corresponding ones of the plurality of tuning values are used for the tunable capacitor while maintaining impedance matching to an input impedance of the low-noise amplifier of the multiband radio receiver or transceiver as quantified by an $s_{11}$ parameter over the operating frequency bands of the multiband radio receiver or transceiver below a pre-defined level. Here, in maximizing the attenuation at the first subharmonics and the second subharmonics, different weights may be attributed to the first and second subharmonics. The values of the first capacitor $C_1$, the second capacitor $C_2$ and the first inductor $L_1$ and the plurality of tuning values of the tunable capacitor $C_t$ may have been selected specifically so as to provide a notch frequency at the first subharmonics (or at least some of them). In such embodiments, the attenuation at the first subharmonics is always larger than the attenuation at the second subharmonics at which there is no notch.

Let us now assume that the receiver is nominally matched to the antenna resistance at $\omega_{RX0}$, where $\omega_{RX0}$ is a (center) frequency of some reception frequency band, and the component values of $C_1$, $C_2$, and $L_{EQ}$ are chosen for optimal operation at this particular (angular) frequency (i.e., to provide a resonance at the first subharmonic and to provide optimal impedance matching). It is further assumed that the proposed high-pass RF filter needs to be configured from the reception frequency of $(\omega_{RX0}-\Delta\omega_{RX})$ to $(\omega_{RX0}+\Delta\omega_{RX})$. That is, the frequency tuning range of the filter is $2\Delta\omega_{RX}$. At the reception frequency of $\omega_{RX}=(\omega_{RX0}\pm\Delta\omega_{RX})$, it can be shown that the magnitude of $s_{11}$ can be approximated as $$|S_{11}(\omega_{RX0} \pm \Delta\omega_{RX})| \approx \frac{\Delta\omega_{RX}}{\omega_{RX0}} \cdot \frac{\omega_{RX0}L_{EQ}}{R_S}. \tag{12}$$

In other words, the quality of the receiver input matching trades here against the tuning range of the tunable high-pass RF filter. A very wide tuning range (or large $\Delta\omega_{RX}/\omega_{RX0}$) results in a large $|s_{11}|$ value (or poor receiver input matching) and vice versa. Acceptable input matching is, however, achievable for moderately wide filter tuning range.

To give an example, we consider a configurable LC high-pass filter of FIG. 2, in which the filter component values are optimized at 2 GHz ($f_{RX0}$), $L_{EQ}$ is 3.8 nH, and $R_S=50\Omega$. For example, targeting for $|s_{11}|$ below $-15$ dB ($|s_{11}|\approx0.18$) at $(\omega_{RX0}\pm\Delta\omega_{RX})$, leads to $\Delta\omega_{RX}/\omega_{RX0}\approx20\%$. Conversely, requiring that $\Delta\omega_{RX}/\omega_{RX0}=10\%$ leads to $s_{11}$ below $-20$ dB. Having a 10% tuning range at 2 GHz means that the proposed LC high-pass filter may be configured, e.g., to LTE frequency bands of 3, 2, and 1 with very good input matching at the receiver input. These frequency bands extend from 1805 MHz to 2170 MHz. In summary, the proposed LC high-pass filter may be configured to sufficiently wide band of frequencies with adequate receiver input matching.

In the following, the operation of the multiband high-pass RF filter 209 of FIG. 2 at the first and second subharmonics of a given operating frequency of the radio receiver or transceiver is discussed in connection with associated equivalent circuits shown in FIGS. 4 and 5. In said discussion, it is assumed that at the given reception frequency ($f_{RX}$), the receiver input impedance $Z_{IN}$ is matched to the antenna resistance ($R_S$, usually $50\Omega$), i.e. $Z_{IN}=R_S$, and thus the receiver RF input voltage is $V_{RX,IN}(\omega_{RX})=V_{ANT}/2$. For simplicity, it is also assumed that $Z_{LNA,IN}(\omega_{RX})\approx R_S$ and thus $V_{LNA,IN}(\omega_{RX})\approx V_{ANT}/2$. In other words, the filter passband ripple or loss is neglected.

Figure 4:
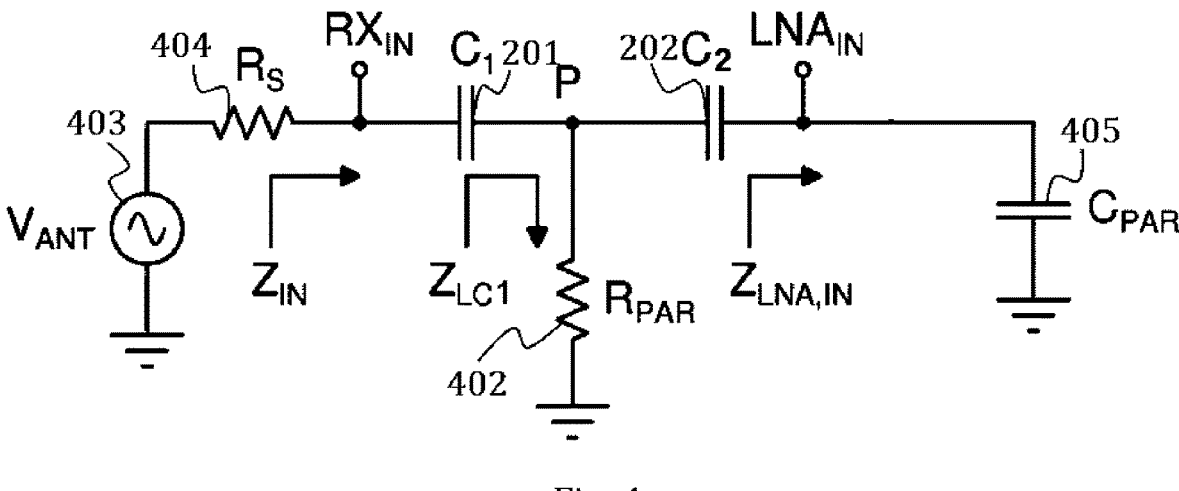
Figure 5:
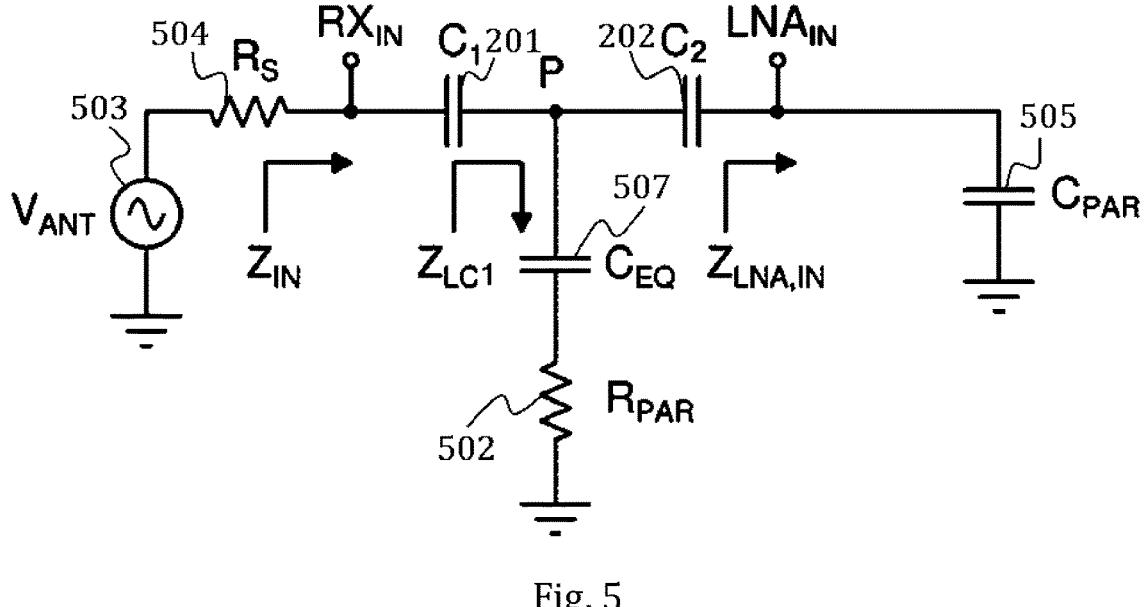

In FIGS. 4 and 5, the elements 403, 404 and elements 503, 504 correspond to respective elements 303, 304 discussed in connection with FIG. 3. Moreover, the same first and second capacitors 201, 202 ($C_1$ and $C_2$) are included in all of FIGS. 2 to 5.

Referring to both FIGS. 4 and 5, it is assumed that at the subharmonic blocking signal frequencies of $f_{RX}/2$ and $f_{RX}/3$, the LNA input impedance ($Z_{LNA,IN}$) is mostly capacitive and can be modelled as a parallel parasitic capacitance $C_{PAR}$ (elements 405, 505). Modelling the LNA input impedance with a parallel parasitic capacitance at $f_{RX}/2$ and $f_{RX}/3$ does not hold for all LNA topologies, but it is a good approximation, for example, in the case of resistive-feedback amplifier, which is a good LNA candidate for use in RF preselection filterless receivers.

Referring to FIG. 4, in the proposed tunable high-pass RF filter (i.e., the tunable RF filter of FIG. 2), the series $L_1C_t$ resonance circuit is set to resonate at the subharmonic blocking signal frequency of $f_{RX}/2$ (i.e., at the first subharmonic), as described above. As a result, the impedance $Z_{LC1}$ of the series $L_1C_t$ circuit at the first subharmonic can be represented by an equivalent resistor $R_{PAR}$ (element 402) at $f_{RX}/2$, as shown in FIG. 4.

The attenuation of the tunable LC high-pass filter according to embodiments at $f_{RX}/2$ can be analysed by considering the equivalent circuit shown in FIG. 4. In this circuit, the LNA input impedance ($Z_{LNA,IN}$) and the impedance of the series $L_1C_t$ resonance circuit ($Z_{LC1}$) are represented by a parallel parasitic capacitance $C_{PAR}$ and equivalent resistor $R_{PAR}$, respectively.

Based on FIG. 4, the attenuation of the LC high-pass filter at $f_{RX}/2$ can be approximated as $$\text{Attenuation}\left(\frac{\omega_{RX}}{2}\right) = \tag{13}$$

$$\left|\frac{V_{LNA,IN}(\omega_{RX})}{V_{LNA,IN}\left(\frac{\omega_{RX}}{2}\right)}\right| = \frac{\sqrt{4+\omega_{RX}^2 C_1^2 (R_S+R_{PAR})^2}}{2\omega_{RX}C_1 R_{PAR}} \times \left(\frac{C_2+C_{PAR}}{C_2}\right),$$

where it is assumed that at $f_{RX}/2$, $R_{PAR}<<2(C_2+C_{PAR})/(\omega_{RX}C_2C_{PAR})$.

From (13), it can be seen that both series capacitors $C_1$ and $C_2$ contribute to the filter attenuation at $f_{RX}/2$. In addition, the first term in (13) is the attenuation from the RX input port (node $RX_{IN}$) to the filter intermediate node P in FIG. 4, whereas the second term represents the attenuation from the node P to the LNA input node (node $LNA_{IN}$).

In practice, usually around 30-dB attenuation can be achieved with the proposed configurable LC high-pass filter for subharmonic frequency blockers at $f_{RX}/2$. Regarding antenna-referred second-harmonic power due to the subharmonic blocker at $f_{RX}/2$, this implies around 60-dB improvement compared to the input-referred distortion power without the filter.

As discussed, in the tunable multiband high-pass RF filter, the series $L_1C_t$ resonance circuit is tuned to the subharmonic blocking signal frequency of $f_{RX}/2$ while the radio receiver is tuned to receive at $f_{RX}$. At $f_{RX}/3$, the impedance $Z_{LC1}$ of the series $L_1C_t$ resonance circuit can be written as $$Z_{LC1}\left(\frac{\omega_{RX}}{3}\right) = \frac{1}{j\frac{\omega_{RX}}{3}\frac{9C_t}{5}} + R_{PAR} = \frac{3}{j\omega_{RX}C_{EQ}} + R_{PAR} \tag{14}$$

in which the aforementioned resonance condition at $f_{RX}/2$ has been used. In other words, since the series $L_1C_t$ resonance circuit is tuned to resonate at $f_{RX}/2$, it can be modelled as an equivalent capacitance $C_{EQ}=9C_t/5$ at $f_{RX}/3$. This is also illustrated in FIG. 5, in which the series $L_1C_t$ resonance circuit is replaced by $C_{EQ}$ 507 (in series with the resistor $R_{PAR}$ 502). As described above, the LNA input impedance ($Z_{LNA,IN}$) is represented by a parallel parasitic capacitance $C_{PAR}$ 505. It should be emphasized that this approximation holds only at $f_{RX}/3$ or at narrow frequency band around it.

Based on FIG. 5, the attenuation of the multiband high-pass RF filter according to embodiments at $f_{RX}/3$ may be approximated as $$\text{Attenuation}\left(\frac{\omega_{RX}}{3}\right) = \left\lVert\frac{V_{LNA,IN}(\omega_{RX})}{V_{LNA,IN}\left(\frac{\omega_{RX}}{3}\right)}\right\rVert = \left(\frac{C_1 + C_p}{C_1}\right) \times \left(\frac{C_2 + C_{PAR}}{C_2}\right) \quad (15)$$

in which $C_P$ is the total capacitance between nodes P and ground looking right from $C_1$:

$$C_P = C_{EQ} + \frac{C_2 C_{PAR}}{C_2 + C_{PAR}}. \quad (16)$$

Here, it is assumed that at $f_{RX}/3$, the equation $$\left(\frac{\omega_{RX}}{3} C_1 C_P R_S\right)^2 \ll (C_1 + C_P)^2$$

holds.

Thus, based on the above equations, it may be observed that both series capacitors $C_1$ and $C_2$ contribute to the filter attenuation at $f_{RX}/3$. In addition, the first term in (15) is the attenuation from the RX input port (node $RX_{IN}$) to the node P in FIG. 5 whereas the second term represents the attenuation from the node P to the LNA input node (node $LNA_{IN}$).

In practice, usually around 15-dB attenuation can be achieved with the tunable LC high-pass filter according to embodiments for subharmonic frequency blockers at $f_{RX}/3$. Regarding antenna-referred third-harmonic power due to the subharmonic blocker at $f_{RX}/3$ this implies around 45-dB improvement compared to the input-referred distortion power without the filter.

Figure 6:
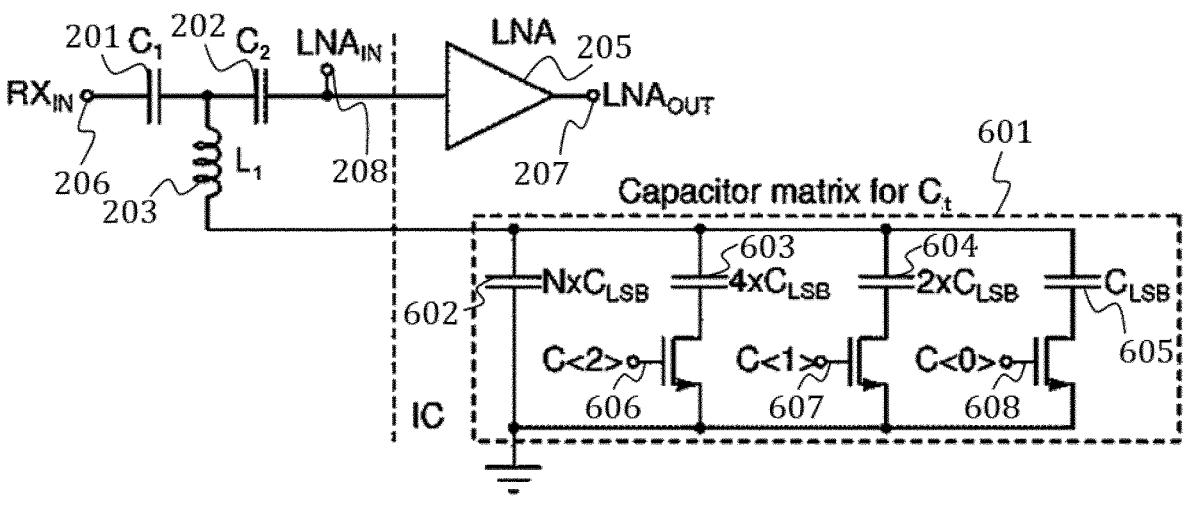
FIGS. 6 to 11 illustrate alternative tunable RF filters according to embodiments connected to associated low-noise amplifiers.

FIG. 6 illustrates a tunable RF filter according to an embodiment suitable for a multiband radio receiver or transceiver such as the radio receiver 100 of FIG. 1. Specifically, FIG. 6 provides a more detailed implementation of the multiband RF filter of FIG. 2. Namely, FIG. 6 illustrates one exemplary detailed implementation for the tunable capacitor 204 ($C_t$) of FIG. 2. The other illustrated elements 201-203, 205-207 may correspond fully to the ones described in connection with FIG. 2.

Referring to FIG. 6, the tunable capacitor 601 of the series resonant circuit is implemented specifically as a capacitor matrix. In the illustrated example, the capacitor matrix 601 has three control bits (C<2:0>) implemented using parallel N-type metal-oxide-semiconductor (NMOS) switches 606, 607, 608 and a fixed capacitor having a value $N \times C_{LSB}$ (with LSB corresponding to "least significant bit" and N being a positive integer). In more general embodiments, the capacitor matrix may have one or more control bits using one or more parallel switches (e.g., NMOS switches) and a fixed capacitor. Each of the NMOS switches 606, 607, 608 is connected in series with a respective capacitor 603, 604, 605. All of said capacitors 603, 604, 605 are implemented, in the illustrated example, as multiple units of $C_{LSB}$, (specifically as $4 \times C_{LSB}$, $2 \times C_{LSB}$ and $1 \times C_{LSB}$, respectively) though this may not be the case in other embodiments.

The illustrated capacitor matrix 601 allows eight different values for capacitance and accordingly, eight different values can be obtained for resonance frequency in the series resonant circuit (formed by elements 203, 601). For example, when all controls bits have a high value (i.e., C<2:0>='111'), all three NMOS switches 606, 607, 608 are conducting and the total capacitance is $C_t=(7+N)C_{LSB}$. This corresponds to the lowest resonance frequency achievable with the series resonant circuit. On the other hand, for instance when all controls bits have a low value (C<2: 0>='000'), none of the NMOS switches 606, 607, 608 are conducting and the total capacitance is $C_2=NC_{LSB}$. With this setting, the highest resonance frequency of the series resonant circuit is obtained.

It should be noted that FIG. 6 illustrates merely one possible example of a capacitor matrix which may be used for implementing the tunable capacitor $C_t$. Many other feasible capacitor matrix implementations are known in the art and are used, for example, in LNAs and voltage-controlled oscillators (VCOs) to tune the operation frequency. Any known capacitor matrix may be employed for implementing the tunable capacitor.

Figure 7:
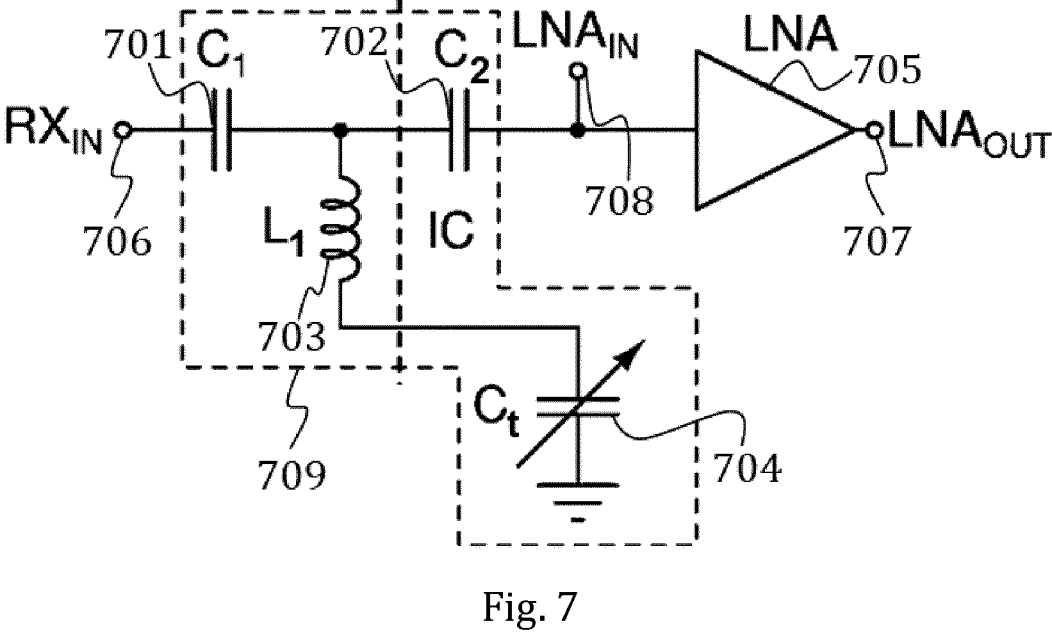
Figure 8:
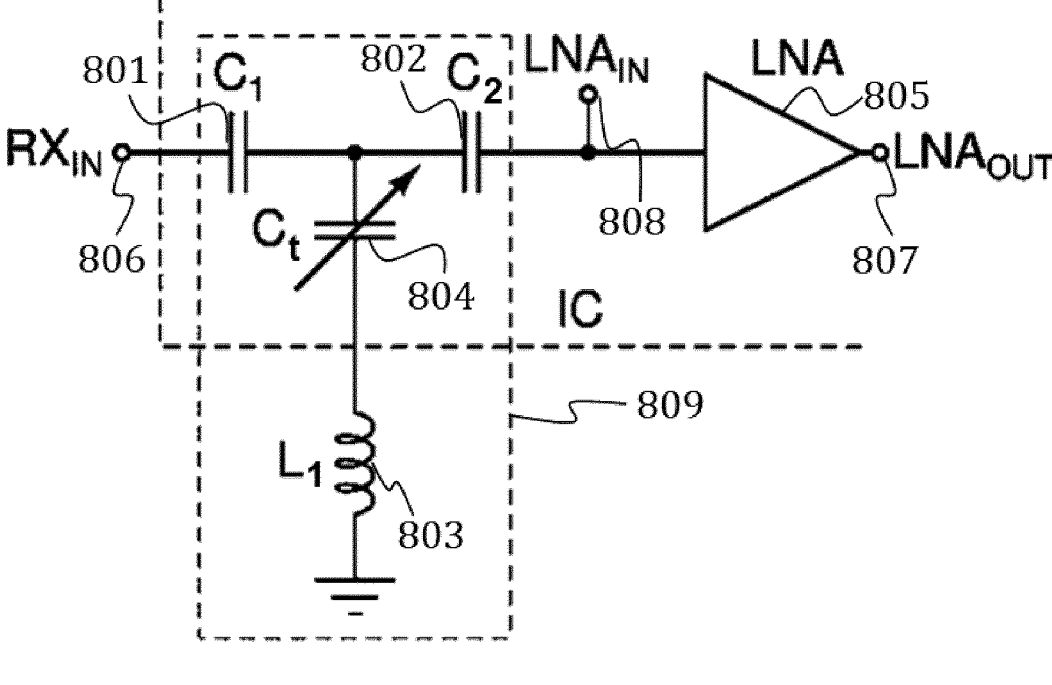

While in the embodiments illustrated in FIGS. 2 and 6 only the tunable capacitor 204 was implemented in an integrated circuit (i.e., "on-chip"), in other embodiments one or more of the other circuit elements of the tunable RF filter may also be implemented on-chip. FIGS. 7 and 8 illustrate two such alternative tunable RF filters according to embodiments. The operating principle of the tunable RF filters 709, 809 remains fundamentally the same as described in connection with above embodiments. Correspondingly, the elements 701 to 709 of FIG. 7 and elements 801 to 809 may fully correspond, respectively, to the elements of 201 to 209 of FIG. 2, apart from differences relating to implementation of circuit elements on-chip or off-chip.

In the tunable RF filter 709 of FIG. 7, in addition to the tunable capacitor $C_t$ 704, also the second capacitor $C_2$ 702 is implemented on-chip while the first capacitor $C_1$ 701 and the first inductor $L_1$ 703 are still implemented as off-chip components. It may be especially beneficial to implement the first inductor $L_1$ 703 as an off-chip component so as to ensure high Q-factor for this component. Achieving high Q-factor for this component is important as it leads to (or at least contributes towards) high filter stopband attenuation and low in-band loss. Moreover, if $L_1$ needs to be off-chip, it makes sense to place $C_1$ also off-chip.

In the multiband RF filter 809 of FIG. 8, in addition to the tunable capacitor $C_t$ 804, also the first and second capacitors $C_1$ & $C_2$ 801, 802 are implemented on-chip. In FIG. 8, also the order of the tunable capacitor 804 and the first inductor 803 has been switched compared to the multiband RF filter 209 of FIG. 2. Such switching may be implemented also in connection with any of the other embodiments.

In embodiments discussed in connection with FIGS. 7 and 8, the on-chip components 702, 704, 801, 802, 804 may be implemented specifically in the same integrated circuit which may (or may not) be an integrated circuit of the radio receiver or transceiver.

Figure 9:
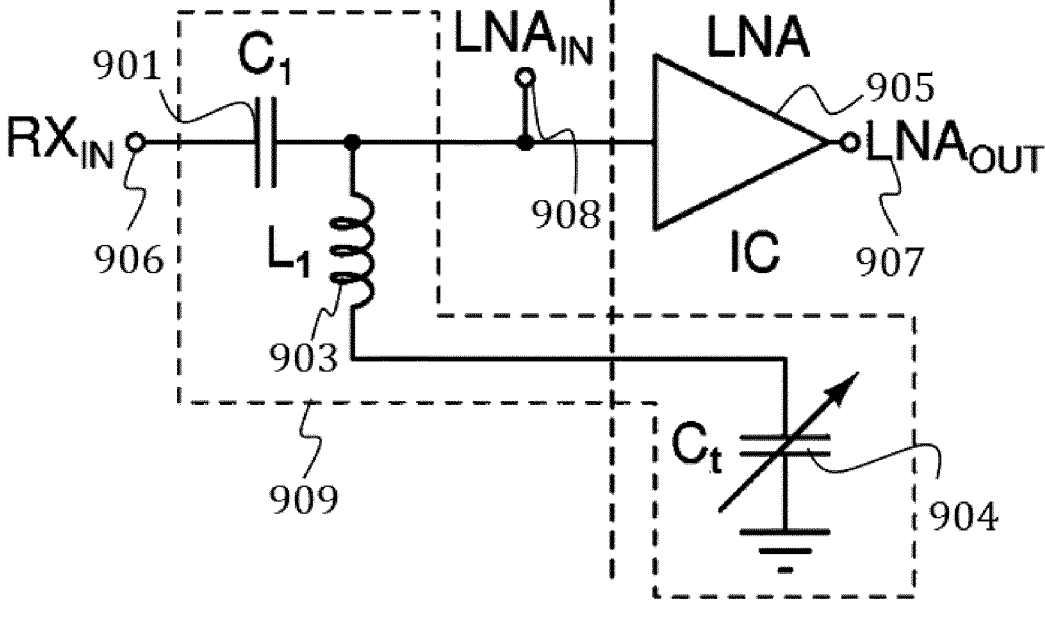

In some applications, it may be possible to tolerate somewhat larger blocking signals at the first and second subharmonics ($f_{RX}/2$ and $f_{RX}/3$) of the (central) frequencies of the operating frequency bands of the radio receiver or transceiver and/or imperfect impedance matching at the operating frequency ($f_{RX}$). In such cases, it may be possible, while still maintaining performance of the associated radio receiver or transceiver within acceptable limits, to omit the second capacitor $C_2$ from the multiband RF filter of FIG. 2. FIG. 9 illustrates a tunable RF filter 909 according to an embodiment omitting the second capacitor $C_2$ and being suitable for a multiband radio receiver or transceiver such as the radio receiver 100 of FIG. 1. Similar to FIGS. 2 to 8, FIG. 9 also shows a single-ended low-noise amplifier 905 (of said multiband radio receiver or transceiver) electrically connected to said tunable RF filter 909 and providing an output (or output port) 907 to further stages of the radio receiver or transceiver (as illustrated in FIG. 1). However, now the single-ended low-noise amplifier 905 is connected directly to a second terminal of the first capacitor 901 and to the non-grounded terminal of the series resonant circuit. In general, the low-noise amplifier 905 may be any low-noise amplifier with a single-ended input (and a single-ended or differential output).

The definitions provided in connection with FIG. 2 apply, mutatis mutandis, also for the tunable RF filter 909 of FIG. 9. The elements 901, 903 to 909 of FIG. 9 may fully correspond, respectively, to the elements of 201, 203 to 209 of FIG. 2 though the values of the circuit elements 901, 903, 904 may need to be chosen differently compared to circuit element 201, 203, 204 for optimal operation. For example, the series resonant circuit comprising the first inductor 903 and the tunable capacitor 904 may, also in this embodiment, be resonant at $f_{RX}/2$, that is, at the first subharmonics of (central or substantially central) frequencies of operating frequency bands of the associated radio receiver or transceiver. However, while, in embodiments which include the second capacitor $C_2$, the value of the second capacitor $C_2$ may be chosen to compensate for the input capacitance of the LNA $C_{LNA}$), in embodiments without the second capacitor $C_2$, the value of the first capacitor $C_1$ may be selected to be (approximately) equal to the input capacitance of the LNA $C_{LNA}$. Looking at (10) describing an impedance matching condition involving $C_2$, it may be observed that, in such a case, the desired value for the second capacitor $C_2$ becomes very large (i.e., the magnitude of the associated impedance becomes very small approximating a short circuit). As a consequence, the second capacitor $C_2$ may be left out in such cases, as depicted in FIG. 9, without seriously compromising impedance matching or blocking at the first and second subharmonics. While the tunable RF filter 909 still provides attenuation for any blocking signals at the first and second subharmonics, the level of attenuation achievable with the tunable RF filter 909 may be somewhat diminished compared to the level of attenuation achievable with the tunable RF filter 209 shown in FIG. 2. It should be noted that the concept of removing the second capacitor $C_2$ may be equally applied to any of the other embodiments discussed above (e.g., in relation to FIGS. 6 to 8) or to be discussed below.

Figure 10:
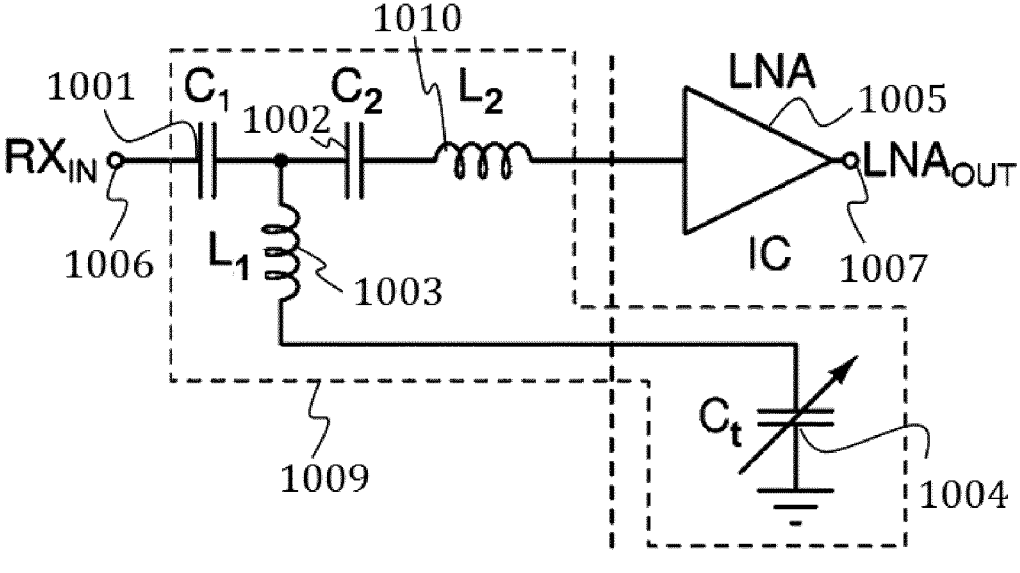

FIG. 10 illustrates another alternative multiband tunable RF filter 1009 according to an embodiment suitable for a multiband radio receiver or transceiver such as the radio receiver 100 of FIG. 1. Similar to FIGS. 2 to 9, FIG. 10 shows, additionally, a single-ended low-noise amplifier 1005 (of said multiband radio receiver or transceiver) electrically connected to said tunable RF filter 1009 and providing an output (or output port) 1007 to further stages of the radio receiver or transceiver (as illustrated in FIG. 1). In general, the low-noise amplifier 1105 may be any low-noise amplifier with a single-ended input (and a single-ended or differential output).

The multiband tunable RF filter 1009 may correspond fully to the multiband tunable RF filter 209 of FIG. 2, apart from the addition of a second inductor $L_2$ 1010 arranged in series with the second capacitor $C_2$ 1002. The elements 1001 to 1009 of FIG. 10 may fully correspond, respectively, to the elements of 201 to 209 of FIG. 2 (though the values of the circuit elements 1001, 1002, 1003, 1004 may be chosen differently compared to circuit elements 201, 202, 203, 204 for optimal operation due to the addition of the second inductor 1010). Said second inductor $L_2$ 1010 may be connected in series with the second capacitor $C_2$ 1002 so that, as shown in FIG. 10, the second inductor $L_2$ 1010 provides a terminal for connecting the LNA 1005 or in a reversed order so that one of the terminals of the second inductor $L_2$ 1010 is connected to the first capacitor $C_1$ 1001 and to the series resonant circuit (comprising elements 1003, 1004). Said second inductor $L_2$ 1010 serves to provide attenuation for blocking signals at frequencies above the operating frequency bands of the radio receiver or transceiver. The value of the second inductor $L_2$ 1010 may be specifically chosen to achieve this goal (i.e., attenuation above the operating frequency bands). Due to the low-pass filtering provided by the second inductor $L_2$ 1010 and high-pass filtering provided by the other circuit elements 1001 to 1004 (especially the series resonant circuit 1003, 1004), the multiband RF filter 1009 may be seen correspond to a bandpass filter in this case (as opposed to just a high-pass filter).

Figure 11:
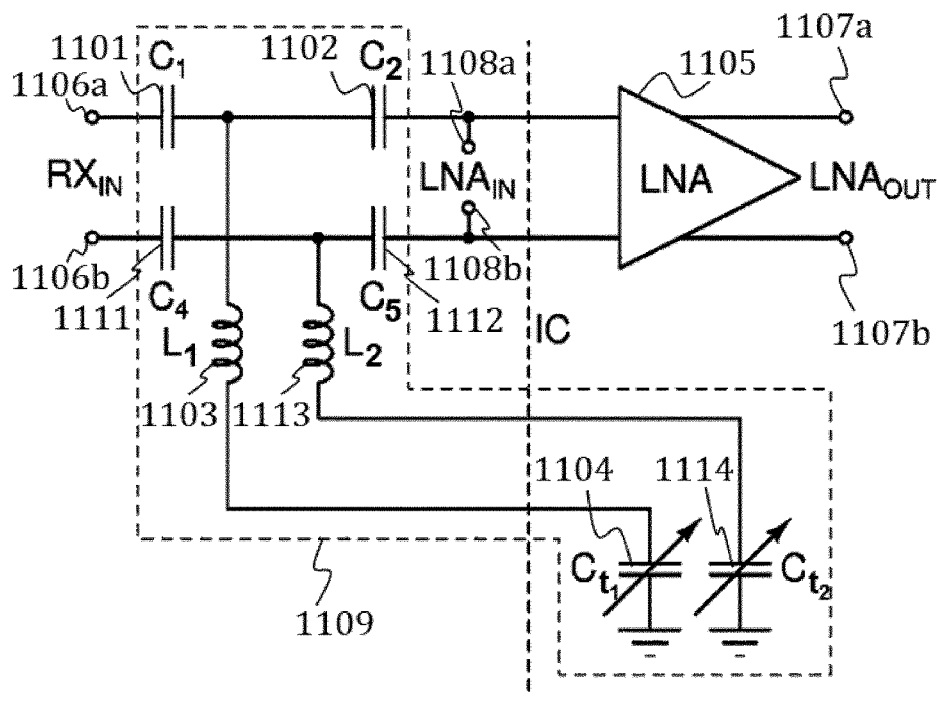

FIG. 11 illustrates another tunable RF filter 1109 according to embodiments suitable for a multiband radio receiver or transceiver such as the radio receiver 100 of FIG. 1. Specifically, the tunable RF filter 1109 being a differential tunable RF filter 1109 is configured to be employed with a low-noise amplifier 1105 having at least a differential input (1108a, 1108b) and optionally also a differential output (1107a, 1107b) as shown in FIG. 11. The differential tunable RF filter 1109 may be connectable to at least one antenna via a balun (not shown in FIG. 11). In other words, the differential tunable RF filter 1109 provides both differential input and output.

As, in differential signaling, common-mode signals are transmitted using two complementary signals (or differential pair of signals) via two separate conductors, any filtering must be carried out for both of these signals separately so as to attenuate any common-mode signal components. Consequently, the number of circuit elements in the differential signaling-based tunable RF filter 1109 is effectively doubled compared to a corresponding single-ended implementation. Accordingly, the differential tunable radio frequency filter 1109 comprises a first (single-ended) tunable radio frequency filter (comprising elements 1101 to 1104) for connecting to a non-inverting input (1108a) of the differential low-noise amplifier 1105 (and to a non-inverting output (1106a) of at least one antenna) and a second (single-ended) tunable radio frequency filter (comprising elements 1111 to 1114) for connecting to an inverting input (1108b) of the differential low-noise amplifier (and to an inverting output (1106b) of at least one antenna). The first and second single-ended tunable RF filters may, as shown in FIG. 11, correspond to the tunable RF filter 209 of FIG. 2 (though the values of the circuit elements 1001 to 1004, 1101 to 1104 may be chosen differently compared to circuit elements 201, 202, 203, 204 for optimal operation due to the differential nature of the implementation). Also in an analogous manner with the tunable RF filter 209 of FIG. 2, at least the first and second tunable capacitors 1104, 1114 of the differential tunable RF filter 1102 may be implemented as on-chip components.

While FIG. 11 corresponds to a differential equivalent of the single-ended tunable RF filter 209 of FIG. 2, in other embodiments, a differential tunable RF filter may be implemented using any of the other single-ended tunable RF filters 609, 709, 809, 1009 of FIGS. 6 to 10 as a basis in a corresponding manner.

In some embodiments, one or both of the first and second tunable capacitors 1104, 1114 may be implemented as a capacitor matrix or capacitor matrices. Said capacitor matrix or matrices may be defined, for example, as discussed in connection with FIG. 6 (and specifically in connection with element 601 of FIG. 6).

While a multiband radio receiver according to embodiments may be implemented by simply adding a tunable RF filter according to any of the above embodiments to the multiband radio receiver 100 of FIG. 1 between the at least one antenna 101 and the low-noise amplifier 102, in some cases, such a solution may not be sufficient to cover all desired operating frequency bands of a radio receiver. In the following, this problem is discussed in connection with LTE IoT applications. The most deployed frequency bands of interest for LTE IoT multiband radio receivers lie approximately between 617-960 MHz and 1805-2170 MHz. So as to cover all of these frequency bands, the LNA in the multiband RF preselection filterless radio receiver according to embodiments would need to be configurable to operate at a frequency range from 617 MHz to 2170 MHz. In practice, it may be difficult to realize and design a wideband or configurable LNA for covering the entire frequency range from 617 MHz to 2170 MHz with sufficient performance. Instead, it might be more beneficial in terms of performance to employ two separate LNAs: the first amplifier for 617-960 MHz and the second amplifier for 1805-2170 MHz.

Similarly, it would be very difficult to configure the proposed tunable RF filter according to embodiments for the entire frequency range of 617-2170 MHz. The relative tuning range of the filter would need to be enormous (2170–617)/1393.5=111%. Instead, it would be more practical to employ two different tunable RF filters according to embodiments: one which is configured to operate at low frequencies (e.g., 617-960 MHz) and another which is configured to operate at high frequencies (e.g., 1805-2170 MHz). The relative tuning range of the two exemplary tunable RF filters are (960 MHz–617 MHz)/788.5 MHz=44% and (2170 MHZ–1805 MHz)/1987.5 MHz=18%, respectively.

Figure 12:
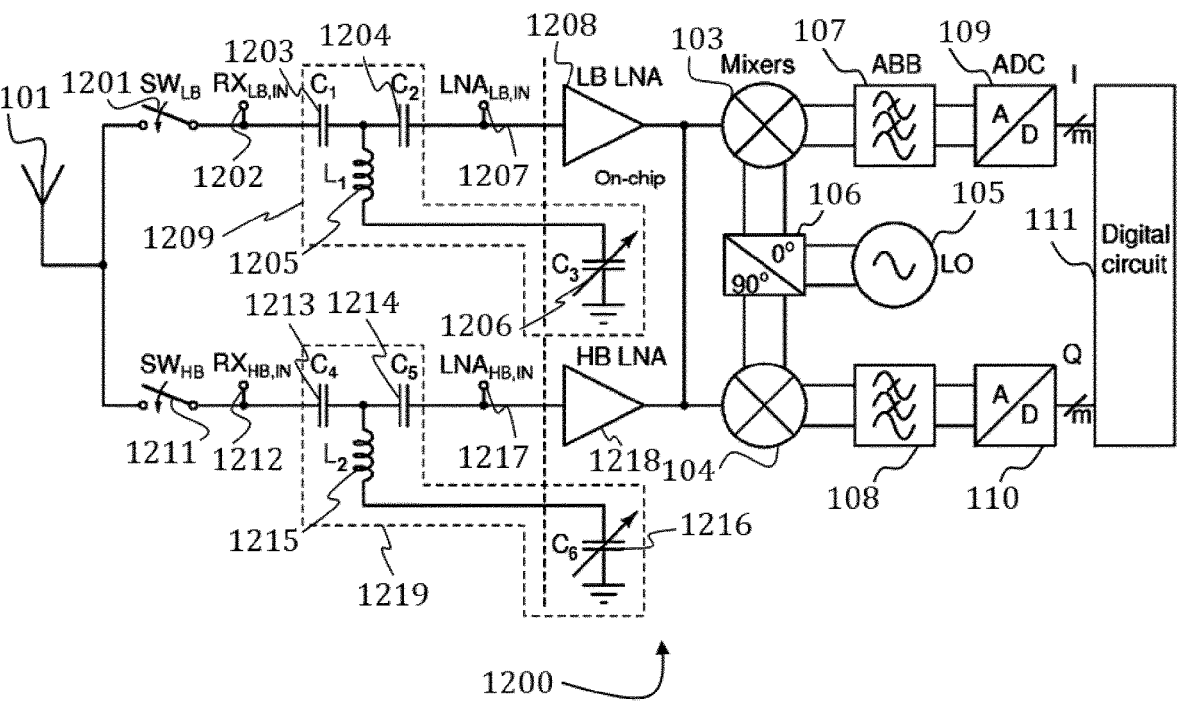
FIG. 12 illustrates a multiband radio receiver according to an embodiment.

FIG. 12 illustrates a multiband radio receiver 1200 according to an embodiment comprising two different low-noise amplifiers and tunable RF filters for covering two different frequency ranges according to the concept discussed above. Said multiband radio receiver 1200 may be employed, for example, in LTE IoT applications as discussed above though is not limited to said applications. In FIG. 12, the abbreviations 'LB' and 'HB' stand for low- and high-band, respectively.

Specifically, the multiband radio receiver 1200 comprises a first single-ended low-noise amplifier 1208 configured to operate at a first frequency range and a second single-ended low-noise amplifier 1218 configured to operate at a second frequency range different from the first frequency range. Moreover, the multiband radio receiver 1200 comprises a first tunable radio frequency filter 1209 preceding the first low-noise amplifier 1208 and configured to operate at a first plurality of frequency bands covering, fully or at least in part, the first frequency range and a second tunable radio frequency filter 1219 preceding the second low-noise amplifier 1218 and configured to operate at a second plurality of frequency bands covering, fully or at least in part, the second frequency range.

The first frequency range may correspond, for example, to a low frequency range (e.g., 617-960 MHz) and the second frequency range may correspond to a high frequency range (e.g., 1805-2170 MHz). As in the example discussed above, the first and second frequency ranges may be fully separate non-overlapping frequency ranges. In other embodiments, the first and second frequency ranges may overlap or be adjacent frequency ranges (sharing one common end point).

Although the multiband radio receiver 1200 with the two multiband RF filters shown in FIG. 12 does not employ conventional band-dedicated RF preselection filters (e.g., surface acoustic wave, SAW, or bulk acoustic wave, BAW, filters), two off-chip RF switches 1201, 1211, labelled here as SW$_{LB}$ and SW$_{HB}$, may, nevertheless, be needed (at least in some embodiments). Said RF switches 1201, 1211 are used for selecting an active receiver chain from the two receiver chains and for isolating the nonactive receiver chain from the at least one antenna 101. In other embodiments, other switching means may be employed for the same purpose.

The at least one antenna 101 and the elements 103 to 111 comprising receiver stages following the low-noise amplifiers 1208, 1218 may be the same or similar elements as described in connection with FIG. 1. Similarly, the discussion regarding the elements 201 to 204 of the tunable RF filter 209 provided above in connection with FIG. 2 applies, mutatis mutandis, for elements 1203 to 1206 and 1213 to 1216 of respective tunable RF filters 1209, 1219 and is, thus, not discussed here in detail. Obviously, in order to configure the first and second tunable RF filters 1209, 1219 to operate at the first and second frequency ranges, different values for the elements 1203 to 1206 (or at least some of them) compared to elements 1213 to 1216 should be used. The elements 1202, 1207, 1212, 1217 may also correspond to corresponding elements discussed above 206, 208.

In the following, the multiband radio receiver architecture shown in FIG. 12 is compared to the conventional multiband receiver architecture with band-dedicated RF preselection filters and corresponding band-dedicated LNAs. Specifically, the comparison corresponds to a case in which the radio receiver needs to support reception at 6 different LTE IoT bands. These frequency bands might be, e.g., frequency bands 12 (729-746 MHz), 5 (869-894 MHz), 8 (925-960 MHz), 3 (1805-1880 MHz), 2 (1930-1990 MHz), and 1 (2110-2170 MHz).

In the multiband receiver architecture 1200 according to embodiments shown in FIG. 12, the frequency bands 12, 5, and 8 would be received by turning the RF switch SW$_{LB}$ 1201 on (SW$_{HB}$ off) and by activating the tunable LB high-pass RF filter 1209 followed by the LB LNA 1208. Similarly, in the multiband radio receiver 1200 shown in FIG. 12, the frequency bands 3, 2, and 1 would be received by turning the RF switch SW$_{HB}$ 1211 on (SW$_{LB}$ off) and by activating the tunable HB high-pass RF filter 1219 followed by the HB LNA 1218. Here, the reception at 6 different frequency bands requires the use of 2 RF switches 1201, 1211, 6 off-chip (low-cost) components or specifically 2 inductors 1205, 1215 (L$_1$ and L$_2$) and 4 capacitors 1203, 1204, 1213, 1214 (C$_1$, C$_2$, C$_3$, and C$_4$), and 4 receiver RF pins in RF integrated circuit (2 for the LNA inputs 1207, 1217 and 2 for the tunable capacitors C$_{t,1}$ and C$_{t,2}$ 1206, 1216). In this exemplary receiver configuration, the receiver circuits (elements 104 to 111) after the LB and HB LNAs 1208, 1218 are common and shared in the reception at different frequency bands.

In comparison, the reception at 6 different frequency bands using a conventional multiband receiver architecture where each frequency band is filter using a frequency-band-specific RF filter and amplified using a frequency-band-specific LNA might require the use of 6 RF switches, 6 band-dedicated RF preselection filters (usually SAW or BAW), and 6 LNAs or at least 6 receiver RF input pins in RFIC. To summarize, although the multiband radio receiver employing the proposed configurable high-pass filters does use off-chip components (6 components 1202 to 1205, 1212 to 1215 in the exemplary receiver shown in FIG. 12), it leads to much lower complexity and BOM compared to the conventional multiband receiver, in which multiple RF preselection filters, RF switches, and LNAs or receiver RFIC input pins are needed. In addition, often the RF preselection filters and LNAs might employ also further off-chip lumped components (i.e., inductors and capacitors) in order to improve performance. Moreover, since off-chip lumped components such as inductors and capacitors are cheap and small in size, they introduce only small increase of BOM in the wireless receiver employing presented configurable high-pass filters and they are anyway usually also needed in the conventional receiver employing multiple RF preselection filters.

While the multiband radio receiver 1200 of FIG. 12 employed two parallel RF chains (each comprising a separate tunable RF filter 1209, 1219 and a separate LNA 1208, 1218), in other embodiments, the number of such parallel RF chains may be one or even larger than two. The number of said parallel RF chains may depend, e.g., on the frequency range or ranges which need to be supported by the multiband radio receiver.

As used in this application, the term 'circuit' refers to one or more of the following: hardware-only circuit implementations such as implementations in only analogue and/or digital circuitry; combinations of hardware circuits and software and/or firmware; and circuits such as a microprocessor(s) or a portion of a microprocessor(s) that require software or firmware for operation, even if the software or firmware is not physically present. This definition of 'circuit' applies to uses of this term in this application. The term "circuit" would also cover, for example and if applicable to the particular element, a baseband integrated circuit, an application-specific integrated circuit (ASIC), and/or a field-programmable grid array (FPGA) circuit for the apparatus according to an embodiment of the invention.

Embodiments described herein are applicable to systems defined above but also to other systems. The specifications of the systems and their elements develop rapidly. Such development may require extra changes to the described embodiments. Therefore, all words and expressions should be interpreted broadly and they are intended to illustrate, not to restrict, the embodiment. It will be obvious to a person skilled in the art that, as technology advances, the inventive concept can be implemented in various ways. Embodiments are not limited to the examples described above but may vary within the scope of the claims.

The invention claimed is:

1. A multiband radio receiver or transceiver comprising:
   at least one low-noise amplifier having, respectively, at least one single-ended input;
   at least one tunable radio frequency filter for preselection in the multiband radio receiver or transceiver, each of the at least one tunable radio frequency filter comprising:
      a first capacitor having a first terminal for connecting to at least one antenna of the multiband radio receiver or transceiver and a second terminal;
      a second capacitor connected, via a first terminal of the second capacitor, to the second terminal of the first capacitor and, via a second terminal of the second capacitor, to a single-ended input of the at least one low-noise amplifier; and a series resonant circuit, connected between the second terminal of the first capacitor and the ground, comprising
      a first inductor and
      a tunable capacitor connected in series with first inductor and having a plurality of tuning capacitance values corresponding to operating frequency bands of the multiband radio receiver or transceiver, wherein the tunable capacitor is implemented in an integrated circuit, the series resonant circuit being configured to be resonant at a plurality of first subharmonics of frequencies of the operating frequency bands when the tunable capacitor is set to the plurality of tuning capacitance values, respectively, a first subharmonic of a given frequency being a frequency equal to said given frequency divided by two.

2. The multiband radio receiver or transceiver according to claim 1, wherein, for each of the at least one tunable radio frequency filter, the series resonant circuit is configured to be resonant at a plurality of first subharmonics of substantially central frequencies of the operating frequency bands of the multiband radio receiver or transceiver when the tunable capacitor is set to the plurality of tuning capacitance values, respectively.

3. The multiband radio receiver or transceiver according to claim 1, wherein, for each of the at least one tunable radio frequency filter,
   the first capacitor, the second capacitor and the first inductor are non-tunable off-chip circuit elements,
   the first capacitor and the first inductor are non-tunable off-chip circuit elements and the second capacitor is a non-tunable circuit element implemented in the integrated circuit or
   the first inductor is a non-tunable off-chip circuit element and the first and second capacitors are a non-tunable circuit elements implemented in the integrated circuit.

4. The multiband radio receiver or transceiver according to claim 1, wherein, for each of the at least one tunable radio frequency filter, the first and second capacitors have different capacitance values.

5. The multiband radio receiver or transceiver according to claim 1, wherein, for each of the at least one tunable radio frequency filter, values of the first capacitor, the second capacitor and the first inductor and the plurality of tuning capacitance values of the tunable capacitor have been selected for optimizing impedance matching to an input impedance of an associated low-noise amplifier of the multiband radio receiver or transceiver over the operating frequency bands of the multiband radio receiver or transceiver while maintaining attenuation at the first subharmonics and second subharmonics of said frequencies of the operating frequency bands above respective pre-defined levels when corresponding ones of the plurality of tuning values are used for the tunable capacitor, a second subharmonic of a given frequency being a frequency equal to said given frequency divided by three.

6. The multiband radio receiver or transceiver according to claim 1, wherein, for each of the at least one tunable radio frequency filter, values of the first capacitor, the second capacitor and the first inductor and the plurality of tuning capacitance values of the tunable capacitor have been selected for maximizing attenuation at the first subharmonics and second subharmonics of said frequencies of the operating frequency bands when corresponding ones of the plurality of tuning capacitance values are used for the tunable capacitor while maintaining impedance matching to an input impedance of an associated low-noise amplifier of the multiband radio receiver or transceiver as quantified by an $s_{11}$ parameter over the operating frequency bands of the multiband radio receiver or transceiver below a pre-defined level, a second subharmonic of a given frequency being a frequency equal to said given frequency divided by three.

7. The multiband radio receiver or transceiver according claim 1, wherein in each of the at least one tunable radio frequency filter, the tunable capacitor is implemented as a capacitor matrix.

8. The multiband radio receiver or transceiver according to claim 1, wherein each of the at least one tunable radio frequency filter further comprises:

a second inductor connected in series with the second capacitor for providing low-pass filtering at frequencies above the operating frequency bands of the radio receiver or transceiver.

9. The multiband radio receiver or transceiver according to claim 1, wherein said at least one tunable radio frequency filter consists of a single tunable radio frequency filter being the only preselection filter of the multiband radio receiver or transceiver.

10. The multiband radio receiver or transceiver according to claim 1, wherein said at least one low-noise amplifier comprises a first low-noise amplifier with a first single-ended input configured to operate at a first frequency range and a second low-noise amplifier with a second single-ended input configured to operate at a second frequency range different from the first frequency range; and said at least one tunable radio frequency filter comprises a first tunable radio frequency filter preceding the first low-noise amplifier and configured to operate at a first plurality of frequency bands covering, at least in part, the first frequency range and a second tunable radio frequency filter preceding the second low-noise amplifier and configured to operate at a second plurality of frequency bands covering, at least in part, the second frequency range.

11. The multiband radio receiver or transceiver of claim 10, further comprising:

switching means for switching between reception via the first tunable radio frequency filter and the first single-ended low-noise amplifier and via the second tunable radio frequency filter and the second single-ended low-noise amplifier.

12. A multiband radio receiver or transceiver, comprising:

a low-noise amplifier with a differential input comprising an inverting input and a non-inverting input;

a differential tunable radio frequency filter acting as a non-band-specific preselection filter of the multiband radio receiver or transceiver, the differential tunable radio frequency filter comprising:

a pair of tunable radio frequency filters comprising a first tunable radio frequency filter for connecting to the non-inverting input of the differential low-noise amplifier and a second tunable radio frequency filter for connecting to the inverting input of the differential low-noise amplifier, wherein each of the at least one tunable radio frequency filter comprises:

a first capacitor having a first terminal for connecting to at least one antenna of the multiband radio receiver or transceiver and a second terminal;

a second capacitor connected, via a first terminal of the second capacitor, to the second terminal of the first capacitor and, via a second terminal of the second capacitor, to the differential input of the low-noise amplifier; and a series resonant circuit, connected between the second terminal of the first capacitor and the ground, comprising a first inductor and a tunable capacitor connected in series with first inductor and having a plurality of tuning capacitance values corresponding to operating frequency bands of the multiband radio receiver or transceiver, wherein the tunable capacitor is implemented in an integrated circuit, the series resonant circuit being configured to be resonant at a plurality of first subharmonics of frequencies of the operating frequency bands when the tunable capacitor is set to the plurality of tuning capacitance values, respectively, a first subharmonic of a given frequency being a frequency equal to said given frequency divided by two.

* * * * *